(12) United States Patent  
Chua et al.

(10) Patent No.: US 7,777,355 B2
(45) Date of Patent: Aug. 17, 2010

(54) INFRARED-BLOCKING ENCAPSULANT WITH ORGANOMETALLIC COLLOIDS

(75) Inventors: Janet Bee Yin Chua, Penang (MY); Kean Loo Keh, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 813 days.

(21) Appl. No.: 11/283,136

(22) Filed: Nov. 17, 2005

(65) Prior Publication Data

US 2007/0108545 A1 May 17, 2007

(51) Int. Cl.
*H01L 51/46* (2006.01)
*H01L 23/29* (2006.01)

(52) U.S. Cl. .............. 257/789; 257/433; 257/792; 257/E51.027

(58) Field of Classification Search .............. 257/443, 257/433, 702, 787, 789, 792, 40, E51.027, 257/E51.044, E33.059, E31.117
See application file for complete search history.

(56) References Cited

U.S. PATENT DOCUMENTS

| 5,252,687 A * | 10/1993 | Shiomi et al. ............... 525/502 |
| 2003/0193545 A1 * | 10/2003 | Boucher et al. .............. 347/50 |
| 2006/0068154 A1 * | 3/2006 | Parce et al. .................. 428/76 |
| 2007/0012965 A1 * | 1/2007 | Sandvik et al. ............. 257/291 |

* cited by examiner

*Primary Examiner*—Anh Phung
*Assistant Examiner*—Allison P Bernstein

(57) ABSTRACT

Organometallic colloid(s) is dispersed in a polymer matrix to form an infrared-blocking encapsulant.

2 Claims, 2 Drawing Sheets

INFRARED-BLOCKING ENCAPSULANT WITH ORGANOMETALLIC COLLOIDS

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Color photodetector arrays, such as color photodetector arrays used in digital cameras, utilize an array of photodiodes or other type of photodetector to record an image. Each photodiode is typically a broad-band detector, that is, the photodiode responds to some degree to all the visible colors, and also to infrared ("IR") light, which is not visible.

To provide color sensitivity, the photodetectors are typically divided into three classes of photodetectors that detect red, green, or blue light. Red, green, and blue transmissive color filters are typically applied to a photodetector array in a particular pattern to provide the red, green, and blue photodetectors. One technique is to apply a small dot of dye having the desired color (e.g. red, green, or blue dye) over each photodetector. However, the dyes that are used to provide color selectivity in the color photodetector array do not effectively block IR light, and an IR filter is incorporated into the color photodetector array. Without an IR blocking filter, ambient IR light could cause overexposure or an exposure error, such as saturation of the photodetector, or incorrect color rendering, such as by causing red photodetectors to register an inaccurately high level of red light.

One approach to providing an IR filter in a color photodetector array device is to attach a piece of glass commonly known as "IR glass," which is formulated to absorb IR light, over the photodetector array. Unfortunately, IR glass is relatively expensive and thick. The thickness increases the height of a packaged device and results in an undesirably heavy assembly that is prone to cracking. Another approach is to attach a thin-film IR filter fabricated on a thin (about 1 mm) glass substrate over the photodetector array. Even an IR filter this thin undesirably increases the package thickness. Thin film filters, while readily available, increase packaging cost. The filter attachment process is relatively slow (in units per hour) and creates a potential for a manufacturing bottleneck, and a tight process control is important for proper filter placement.

Therefore, an improved technique for providing IR filtering with a photodetector array is desirable.

BRIEF SUMMARY OF THE INVENTION

Organometallic colloid(s) is dispersed in a polymer matrix to form an infrared-blocking encapsulant.

DETAILED DESCRIPTION OF THE EMBODIMENTS

Figure 1A:
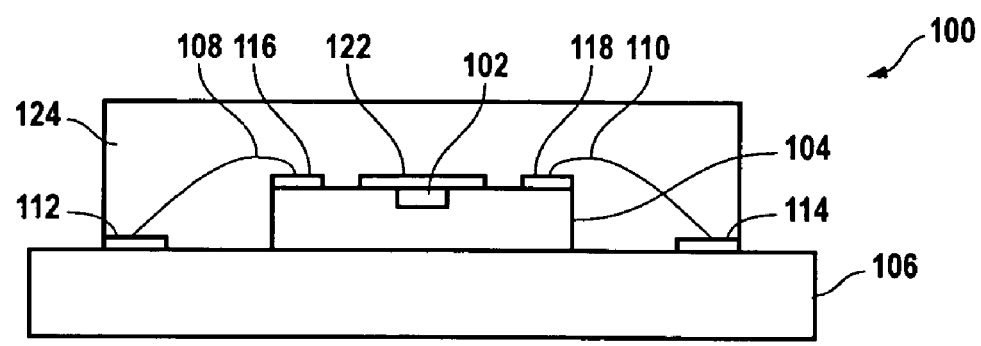
FIG. 1A shows a side view of an encapsulated photodetector device according to an embodiment of the invention.

FIG. 1 shows a side view of an encapsulated photodetector device 100 according to an embodiment of the invention. A photodetector 102 is fabricated in a semiconductor die ("chip") 104, such as a silicon die. The die 104 is attached to a substrate 106 using conventional die-attach techniques, such as conductive epoxy or eutectic die attach techniques. Bonding wires 108, 110 provide electrical connections from bonding pads 112, 114 on the substrate 106 to bonding pads 116, 118 on the die 104. In a particular embodiment, the substrate 106 is a printed circuit board ("PCB"), such as an FR-4™ printed circuit board that provides wiring traces from the bonding pads 112, 114 to the desired locations on the PCB according to the intended application. In a particular embodiment, a heat sink (not shown), such as a copper foil, is included between the substrate and die.

A color pigment filter 122 is applied over the photodetector 102 to provide color selectivity. For example, a blue-transmissive ("blue") color pigment filter is applied over the photoconductor to provide a blue photodetector, that is, a photodetector that is more responsive to blue light than to other colors of light in the visible portion of the spectrum. Alternatively, the color pigment filter is a red-transmissive ("red") filter or a green-transmissive ("green") filter, or other color or colors, such as magenta, yellow, or cyan. However, many color pigment filters do not block IR light, which can interfere with the desired operation of the photodetector. Generally, if significant IR light is present at the photodetector along with colored light, the photodetector will read too much light. The IR light essentially overexposes the photodetector.

IR-blocking encapsulant with organometallic colloids 124 covers the die 104 and the bonding wires 108, 110 to protect them from mechanical damage and from environmental damage, such as corrosion. The IR-blocking encapsulant with organometallic colloids 124 includes a polymer matrix, such as an optical epoxy or clear epoxy casting resin, into which a selected amount of organometallic colloids have been mixed. The organometallic colloids are microscopically small, and are not separately shown. In a particular embodiment, PT1002/PT542 epoxy, available from PACIFIC POLYTECH INC. of Novato, Calif. is used. Alternatively, other epoxies or other types of polymers are used, such as epoxy-amine, transparent polyester, cross-linkable polyurethane, UV curable epoxy resin, polycarbonate, cyclic olefin polymers or copolymers, polyamides, polymethylacrylates ("PMMAs"), liquid crystal polymers ("LCPs"), and polysulfones.

In a particular embodiment, a silicone-based or other elastomer is used for the matrix. Silicone elastomer is more compliant than cured epoxy resin, and generates less thermal stress on the bond wires and between the substrate and die. Suitable elastomeric encapsulants include silicones, fluorosilicones, perfluoropolymers, and amphorous fluoroplastics. Suitable elastomeric encapsulants are available from NUSIL TECHNOLOGY of Carpenteria, Calif.

The organometallic colloids in the encapsulant absorb IR light before it reaches the photodetector 102. The cutoff wavelength can be varied from about 785 nano-meters ("nm") to about 795 nm by selecting the metallic composition, such as palladium, platinum, or nickel of the organometallic colloid, or mixtures thereof. In a particular embodiment, the organometallic colloid has the general composition $M(tdi)_2$, where M is a metal such as Pd, Pt, or Ni, and "tdi" is toluenediamine. Alternatively, the metal is attached to benzophenonediamine ("bpdi") or generally the substituents of σ-phenylenediamine complexes on the benzene rings.

In a particular embodiment, a Pt-based organometallic colloid $(Pt(C_4H_2N_4)_2)$ was produced by stirring solution of potassium tetrachloroplatinate (II) in a 1:1 water and methanol mixture. Only a small quantity of triethylamine was added (less than 5 equivalent to that of diaminomaleonitrile). The solution turned an intense blue green after 15 minutes and was filtered. The solution was then evaporated until almost dry under vacuum and the product was repeatedly washed with water. The product was extracted with acetone and purified by re-crystallization twice from the acetone (yield 20%). Between 0.25-2.5 g of triethylamine was added (less than 5 equivalents to that of diaminomateonitrile) to a stirred solution of potassium tetrachloroplatinate (II) in a 1:1 water:methanol mixture. The solution turned an intense blue-green after 15 minutes, and was filtered. The filtered solution was reduced by vacuum evaporation until almost dry. The reminder was washed with de-ionized water several times. The organometallic colloids were extracted from this product using acetone and re-crystallization, and then repeating the acetone solution and re-crystallization steps. The yield of $Pt(C_4H_2N_4)_2$ was approximately 20% of the potassium tetrachloroplatinate (II) precursor.

The resulting organometallic colloid $(Pt(C_4H_2N_4)_2)$ had a cut-off wavelength of about 710 nm. That is, the organometallic colloid blocked about 90% of the IR light having a wavelength greater than or equal to about 650 nm, and essentially all IR light 705 nm or longer. The transmittance at 520 nm is about 90% (only 10% loss at this wavelength). The cut-off wavelength can be selected to complement the deficiencies of the color pigment filter by substituting other metals, such as Pd or Ni, in the organometallic colloid. For example, by substituting Pt with Pd or Ni, the cut-off wavelength can be moved +/−5 nm. It is generally desired to block light at wavelengths of 700 nm and longer because that light does not significantly contribute to the color of the visible light that is desired to be detected, but can still cause a photodetector output.

The starting materials used to prepare the initial chemical solution can be altered to exhibit a greater change in cut-off wavelength and filter transmission characteristics. In a particular embodiment, about 10 vol. % of organometallic colloid was added to an epoxy encapsulant to provide IR filtering for a photodetector assembly. With small parts, concentrations of 5-10 vol. % are typically preferred. Embodiments alternatively have higher concentrations, which is generally desirable to provide more IR blocking; however, undesirably high concentrations may cloud the encapsulation or promote delamination. Higher concentrations, such as concentrations of about 10-20 vol. % can be used for encapsulating larger photodetector components. In a particular embodiment, a concentration of 50 vol. % is used with very small particles of organometallic nanoparticles, which produces less clouding than larger particles.

For example, an embodiment using $Pd(tdi)_2$ had a cut-off wavelength of about 785 nm, $Ni(bpdi)_2$ had a cut-off wavelength of about 825 nm, and $Pt(bdi)_2$ had a cut-off wavelength of about 710 nm, where "bdi" is beta-diiaminate. The cut-off wavelength can be varied from about 700 nm to about 825 nm depending on the proportion of (bdi), (tdi) and (bpdi) used. In a particular embodiment, the cut-off wavelength is varied from about 785 nm to about 795 nm by varying the composition (relative proportion) of Pd, Pt, and Ni in the encapsulant.

Figure 1B:
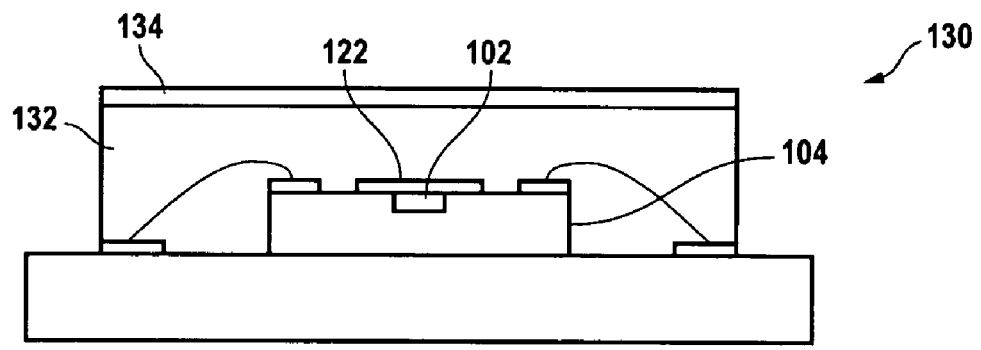
FIG. 1B shows a side view of an encapsulated photodetector device according to another embodiment of the invention.

FIG. 1B shows a side view of an encapsulated photodetector device 130 according to another embodiment of the invention. A die 104 with a photodetector 102 is encapsulated in conventional encapsulant 132, such as a clear casting epoxy. A color pigment filter 122 is applied over the photodetector 102 to provide color selectivity. An organometallic colloid film 134 formed on the encapsulant 132 overlies the photodetector 102. The organometallic colloid film 134 includes one or more types of IR-absorbing organometallic colloids, described above in reference to FIG. 1A, in a binder or carrier. In one embodiment, the IR-absorbing organometallic colloids are dispersed in a carrier that substantially evaporates after application to the encapsulant. Alternatively, the IR-absorbing organometallic colloids are dispersed in a binder or carrier that does not substantially evaporate, such as a UV-curable, silicone, thermosetting, or thermoplastic carrier. Alternatively, organometallic colloids are incorporated in a pigment color filter.

Figure 2:
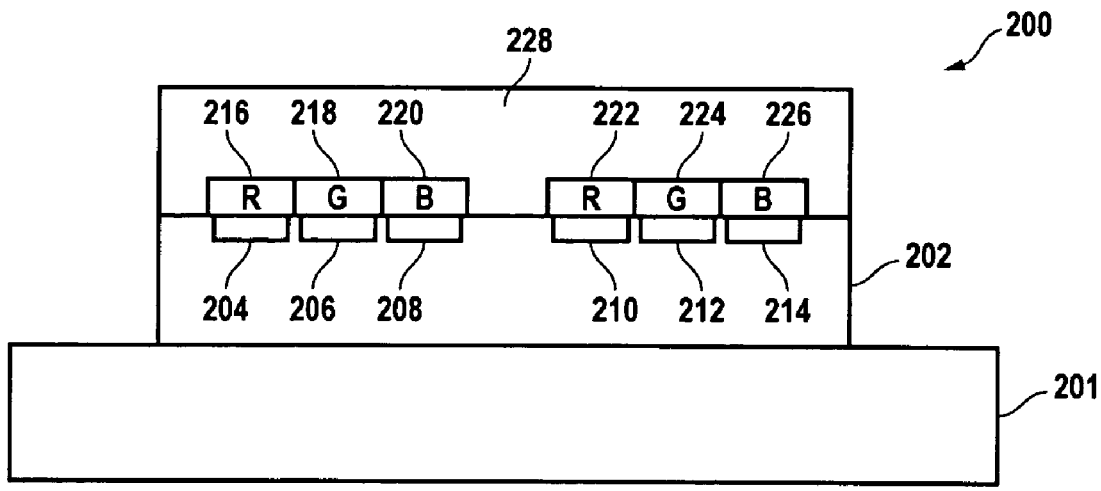
FIG. 2 shows a side view of an encapsulated color photodetector array according to another embodiment of the invention.

FIG. 2 shows a side view of an encapsulated color photodetector array device 200 according to another embodiment of the invention. The encapsulated color photodetector array device is used in a variety of imaging applications, such as digital cameras. Such color photodetector arrays commonly have millions of picture cells ("pixels") and sophisticated electronic wiring and control, as is well-known in the art of digital imaging, and which is omitted from FIG. 2 for clarity and simplicity of illustration.

A color sensor array die 202 has a plurality of photodetectors 204, 206, 208, 210, 212, 214 that are generally sensitive to a range of light wavelengths. The color sensor array die 202 is mounted on a substrate, such as a package base 201. Color pigment filters 216, 218, 220, 222, 224, 226 overlie the photodetectors to provide color-selective photodetection. For example, red color pigment filters 216, 222 provide red color detection, green color pigment filters 218, 224 provide green color detection, and blue color pigment filters 220, 226 provide blue color detection.

IR-blocking encapsulant with organometallic colloids 228 includes a polymer matrix, such as an optical epoxy or other polymer, into which a selected amount of organometallic colloids have been mixed, as described above in reference to FIG. 1A. The IR-blocking encapsulant with organometallic colloids 228 blocks IR light from entering the red, green, and blue photodetectors.

Encapsulant is typically applied to current photodetector arrays to provide mechanical and environmental protection. In conventional color photodetector array devices, an IR filter is added after encapsulation, which increases the number of manufacturing steps, package height and component count. Including organometallic colloids in encapsulant provides IR filtering without the processing steps of attaching a separate IR filter. Encapsulant with organometallic colloids reduces the packaging height and weight, which are both very desirable in digital imaging applications, and avoids an additional glass component (i.e. an IR filter formed on a glass substrate or a piece of IR glass) that might crack or delaminate. Finally, encapsulants with organometallic colloids are easily incorporated into existing photodetector array manufacturing sequences and apparatus.

In a particular embodiment, $[Pd(bdi)_2]$ having a cutoff wavelength of 710 nm allows transmission of less than 10% of light at 650 nm. Typical concentrations for the organometallic colloids are between about 5 weight percent and about 15 weight percent, depending on the thickness of the encapsulation layer. For example, a 300 micron-thick IC die mounted on a 200 micron-thick lead frame has an encapsulation layer about 250 microns thick, for a total packaged device thickness of about 750 microns. In another example, a packaged device about 1 mm total thickness has an encapsulant layer about 500 microns thick. Generally, the concentration of organometallic colloids can be reduced in the thicker encapsulant layers. These thickness and concentrations are merely exemplary.

The response of a photodetector in the visible region is not significantly affected by the IR-blocking encapsulant layer because that is reduced by the transmittance of the encapsulant in the visible region can be electronically compensated. For example, if the blue color detector has a peak sensitivity at about 455 nm and the green color detector has a peak sensitivity at about 535 nm, gain is increased to the electric output from the blue color detectors to compensate for the additional transmittance loss of blue light through the encapsulant, compared to the green light lost through the encapsulant. Similarly, even though the encapsulant with organometallic colloids blocks over 50% of the light at 595 nm, commonly known compensation techniques are used to color balance the color image captured by an imaging device with encapsulant having organometallic colloids. In particular, similar color balancing techniques are used in color sensor array devices using conventional IR filters.

Figure 3:
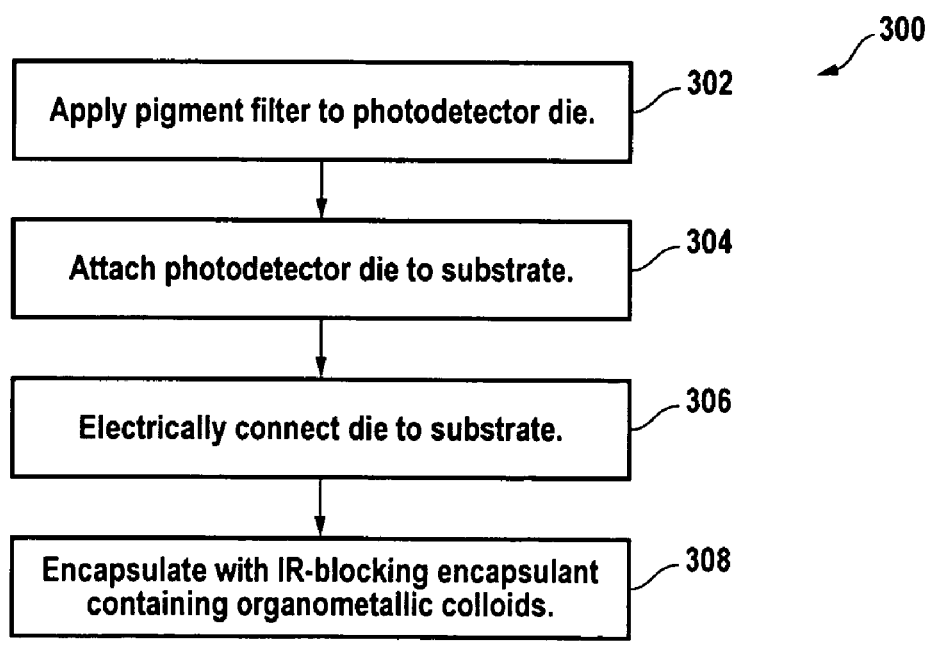
FIG. 3 is a flow chart illustrating the processing steps to manufacture an encapsulated package according to an embodiment of the invention.

FIG. 3 is a flow chart illustrating a method 300 of manufacturing an encapsulated photosensor according to an embodiment of the invention. A pigment filter(s) (e.g. a red, green or blue pigment filter) is applied to a die that includes a photodetector (step 302). In a particular embodiment, the die includes a color photosensor array suitable for producing a color image, and a plurality of pigment filters of different colors are applied to the photosensor array. The die is attached to a substrate (step 304) and electrically connected (step 306), such as by wire bonding, flip-chip, solder bump or other packaging technique.

Encapsulation having IR absorbing organometallic colloids is formed over at least the pigment filter (step 308), and in a particular embodiment, over the pigment filter and the wire bonds. The encapsulation blocks IR light from entering the photodetector.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. An infrared-blocking encapsulant comprising: a polymer matrix; at least one organometallic colloid dispersed in the polymer matrix so as to block infrared light, wherein the organometallic colloid comprises at least one metal selected from the group consisting of platinum, palladium, and nickel.

2. The infrared-blocking encapsulant of claim 1 wherein the organometallic colloid comprises at least one additional composition selected from the group consisting of toluenediamine, benzophenonediamine, and beta-diiaminate.

* * * * *